United States Patent
Higuma et al.

(10) Patent No.: US 6,836,677 B2
(45) Date of Patent: Dec. 28, 2004

(54) BOLOMETER AND METHOD FOR PRODUCING BOLOMETER

(75) Inventors: Hiroko Higuma, Tokyo (JP); Shoji Miyashita, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 210 days.

(21) Appl. No.: 10/239,412

(22) PCT Filed: Aug. 13, 2001

(86) PCT No.: PCT/JP01/06981

§ 371 (c)(1),
(2), (4) Date: Sep. 24, 2002

(87) PCT Pub. No.: WO02/39508

PCT Pub. Date: May 16, 2002

(65) Prior Publication Data

US 2003/0098445 A1 May 29, 2003

(30) Foreign Application Priority Data

Nov. 8, 2000 (JP) .................................. 2000-340246

(51) Int. Cl.$^7$ ........................... H01L 37/00; G01K 7/16
(52) U.S. Cl. .................... 505/161; 374/32; 374/176; 250/336.1; 250/336.2
(58) Field of Search ................. 505/161, 847; 257/467, 43, 613; 374/176, 32; 204/192.1; 250/336.1, 336.2

(56) References Cited

U.S. PATENT DOCUMENTS 5,572,060 A    11/1996    Butler et al.
5,821,598 A    10/1998    Butler et al.

FOREIGN PATENT DOCUMENTS

| JP | 1-246132 | | 10/1989 |
| JP | 04132613 | * | 5/1992 |
| JP | 5-55642 | | 3/1993 |
| JP | 5-335609 | | 12/1993 |
| JP | 6-287100 | | 10/1994 |
| SU | 173208 | * | 7/1965 |

OTHER PUBLICATIONS

Schwierzi et al (Highly sensitive HTSC–bolometers on Si–membranes; "Controlled Processing of High–Temperature Superconductors: Fundamentals and Applications", International Workshop on Superconductivity, Kihei, Hawaii, Jun. 18–21, 1995, 436–437.). Abstract.*

Kopelev et al (Preparation and properties of cesium and sodium copper oxides; Zhurnal Neorganicheskoi Khimii (1991), 36(11), 2745–52). Abstract Only.*

Nevriva et al (Phase equilibria study in the partially open Cu–(O) and Me–Cu–(O) (Me =Ba, Bi, Sr) systems; Thermochimica Acta (1996), 282/283, 205–225). Abstract Only.*

Goldman "High Temperature Superconducting Compounds", Cov. Rep. Announce. Index (U. S.) 1993, 93(10), Abstract. No. 330, 328.*

* cited by examiner

*Primary Examiner*—Mark Kopec
(74) *Attorney, Agent, or Firm*—Leydig, Voit & Mayer, Ltd.

(57) ABSTRACT

A bolometer thin film having a high temperature coefficient of resistance (|TCR|) is produced in a simple and easy production process to provide a highly sensitive infrared sensing element. The invention provides a bolometer using a thin film of an oxide represented by $Z_yCuO_x$, wherein Z is one or more alkaline earth metals, one or more rare earth element selected from yttrium and lanthanide elements, one or more elements belonging to Period 5 or Period 6 of the Periodic Table selected from bismuth, lead, thallium, mercury, and cadmium, or potassium or sodium, y is a number satisfying $0 \leq y \leq 2$, and x is a number satisfying $0.5y < x \leq 1.5 + 2y$. The bolometer has a temperature coefficient of resistance (|TCR|) higher than that of conventional bolometers. This bolometer is produced by forming a bolometer thin film by sputtering using a mixture of an oxide of Cu such as $Cu_2O$, CuO or a mixture of $Cu_2O$ and CuO with an oxide of any of the elements represented by Z, or a complex oxide of these elements as a target.

13 Claims, 4 Drawing Sheets

BOLOMETER AND METHOD FOR PRODUCING BOLOMETER

TECHNICAL FIELD

This invention relates to a bolometer material and a bolometer thin film that are suitable for use in a non-cooled infrared sensing element which reads signals on radiation intensity of infrared radiation by the use of a material that absorbs incident infrared radiation, changes its temperature to thereby change its electrical resistance with the temperature change, as well as to a method for producing a bolometer thin film and an infrared sensing element utilizing these techniques.

BACKGROUND ART

In typical bolometer-type infrared sensing elements, a photoreceptor absorbs incident infrared radiation to thereby change its temperature, the temperature change of the photoreceptor then causes a change in electrical resistance of a material in the photoreceptor, and the radiation intensity of the infrared radiation is detected as an electrical signal based on the change in electrical resistance. The sensitivity of detection increases with an increasing temperature-dependency (temperature coefficient of resistance; TCR) of the electrical resistance change. Thin films for use in bolometer-type non-cooled infrared sensing elements are thin films which absorb infrared radiation at room temperature to change their temperatures to thereby change their electrical resistance. As such thin films, thin films made of silicon (Si), germanium (Ge), or divanadium trioxide ($V_2O_3$) used as semiconductor materials have been used in practice. Silicon (Si) has a |TCR| of about 1.5%/deg., and the divanadium trioxide ($V_2O_3$) thin film having a relatively high sensitivity has a |TCR| at room temperature of about 2.0%/deg.

To further improve the sensitivity of such non-cooling infrared sensing elements, an infrared sensing element using a bolometer having a temperature coefficient of resistance (|TCR|) at 20° C. of 0.4 to 3.9%/K has been proposed. The bolometer material for use in the infrared sensing element in question is a semiconductor including a crystalline or polycrystalline oxide or fine-structured amorphous substance comprising (1) one or more elements selected from barium, strontium, and calcium, (2) one or more elements selected from yttrium, lanthanum, and rare earth elements, (3) copper, and (4) oxygen. More specifically, the material is a yttrium (Y)-barium (Ba)-copper (Cu)-oxygen (O) system (hereinafter briefly referred to as "YBCO") material having a compositional ratio of Y:Ba:Cu:O of 1:1.2–2.1:3:7–9 (Japanese Unexamined Patent Application Publication No. 11-500578).

FIG. 4(A) illustrates an example of a configuration of an infrared sensing element using such a conventional YBCO thin film as described in Japanese Unexamined Patent Application Publication No. 11-500578 as a bolometer thin film. FIG. 4(A) is a cross sectional view of the infrared sensing element. FIG. 4(A) shows that the conventional infrared sensing element comprises a silicon (Si) substrate 100 and a monolithic transducer structure 108 floated over a cavity 107. FIG. 4(B) is a top view of the silicon substrate 100. In FIG. 4(B), the top of the cavity 107 is almost continuously formed along the outer periphery of the monolithic transducer structure 108 except for part of the outer periphery. A portion remaining after etching serves as a support 109 and fixes the monolithic transducer structure 108 to the silicon substrate 100. The monolithic transducer structure 108 has a multilayer structure as shown in FIG. 4(A). Specifically, the monolithic transducer structure 108 comprises a first silicon nitride layer 101, a first yttrium-stabilized zirconia layer 102, a YBCO layer 103, a second yttrium-stabilized zirconia layer 104, and a second silicon nitride layer 105. A metallic lead 106 is electrically connected with the YBCO layer 103. The second silicon nitride layer 105 plays roles as a protecting film and as the support 109.

The sensitivity of such infrared sensing elements is proportional to the temperature coefficient of resistance (TCR) and is inversely proportional to voltage noise induced by various causes occurring upon the manufacture of the infrared sensing elements. The resistance increases or decreases with temperature change, but the temperature coefficient of resistance is evaluated on the basis of the absolute value of the change of the resistance and is hereinafter referred to as "|TCR|".

To increase the sensitivity of non-cooled infrared sensing elements, |TCR| at room temperature should be equal to or more than 2.5%/deg. and should preferably be equal to or more than 3.0%/deg. As is described above, conventional silicon (Si), germanium (Ge) or divanadium trioxide ($V_2O_3$) thin films each have |TCR| less than 2.5%/deg., and resulting infrared sensing elements cannot have high sensitivity, as long as they include these thin films as a bolometer.

The YBCO thin film has a high |TCR| at room temperature, exhibits a low noise voltage and is a promising bolometer thin film to increase the sensitivity of infrared sensing elements. However, YBCO materials are apt to absorb moisture and carbon dioxide gas upon manufacture and, when they are used as a sputtering target, the resulting target splits in some cases. In addition, the YBCO thin film exhibits an increased electric resistance when it is left in the air, thus causing variations and deterioration upon handling.

The present invention has been accomplished to solve these problems, and it is an object of the present invention to provide a bolometer material having a high temperature coefficient of resistance (|TCR|), to provide a bolometer thin film exhibiting low voltage noise and a small variation in electric resistance and a method for producing the same, and to provide a highly sensitive infrared sensing element using the bolometer thin film.

DISCLOSURE OF INVENTION

To achieve the above objects, the present invention provides a bolometer material mainly comprising an oxide represented by formula: $Z_yCuO_x$, wherein Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium; y is a number satisfying the following condition: $0<y\leq2$; and x is a number satisfying the following condition: $0.5y\leq x\leq1.5+2y$.

The bolometer material of the present invention may mainly comprise $CuO_x$ wherein y in the elemental compositional formula equals zero.

In the bolometer material of the present invention just mentioned above, x in $CuO_x$ may satisfy the following condition: $0.5<x<1.2$ In the bolometer material of the present invention, x in $CuO_x$ may satisfy the following condition: $0.6\leq x<1.0$ In the bolometer material of the present invention, Z may be an element selected from alkaline earth metals.

In the bolometer material of the present invention, it is preferred that Z is an alkaline earth metal, y satisfies the following condition: 0<y<1.2, and x satisfies the following condition: y<x≦1.5+y In the bolometer material of the present invention, Z may be a rare earth element selected from yttrium and lanthanoid elements.

Z in the bolometer material of the present invention may be an element belonging to Period 5 or Period 6 of the Periodic Table selected from bismuth, lead, thallium, mercury and cadmium.

Z in the bolometer material of the present invention may also be an alkali metal selected from potassium and sodium.

In the bolometer material, Z in the elemental compositional formula may be a rare earth element selected from yttrium and lanthanoid elements, and the bolometer material may further comprise an oxide of an alkaline earth metal selected from beryllium and magnesium.

The bolometer material mainly comprising the oxide according to the invention may further comprise lithium or gold as an accessory component.

The present invention also provides a bolometer thin film mainly containing the bolometer material mainly comprising any of the oxides according to the invention and having an amorphous structure as its crystal structure.

In addition, the present invention provides a method for producing a bolometer thin film. The method includes the step of forming a bolometer thin film, the bolometer thin film mainly comprising an oxide represented by formula: $Z_yCuO_x$, wherein Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium; y is a number satisfying the following condition: 0≦y≦2; and x is a number satisfying the following condition: 0.5y<x≦1.5+2y, by sputtering using a mixture of an oxide of Z and an oxide of Cu or a complex oxide of these elements as a target.

The method for producing a bolometer thin film of the invention may include the step of forming a bolometer thin film mainly comprising $CuO_x$, wherein 0.5<x<1.2, by sputtering using $Cu_2O$, CuO, or a mixture of $Cu_2O$ and CuO as a target.

In addition and advantageously, the present invention provides a bolometer-type infrared sensing element for electrically detecting a temperature change induced by absorption of infrared radiation, including:

a silicon substrate;

a silicon dioxide layer lying over the silicon substrate;

a wiring layer lying over part of the silicon dioxide layer;

an electrode layer lying over part of the wiring layer and part of the silicon dioxide layer; and a bolometer thin film lying over part of the electrode layer and part of the silicon dioxide layer, which bolometer thin film mainly comprises the bolometer material mainly containing any of the oxides according to the present invention and has an amorphous structure as its crystal structure.

In the infrared sensing element, the electrode layer may be patterned in a multi-fingered form.

In this connection, in oxides represented by "$Z_yCuO_x$" for use in the bolometer material and others of the present invention, Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium. A mixture of two or more types of elements can be used as Z in respective groups of the alkaline earth metals, of rare earth elements and of elements belonging to Period 5 or Period 6 of the Periodic Table for the similarity of the elements belonging to one group. However, a mixture of two or more types of elements belonging to two or more of these groups cannot be used to achieve the objects of the present invention.

The oxide represented by "$Z_yCuO_x$" for use in the present invention can be a simple mixture, a complex oxide, or a compound of the elements represented by Z and a copper oxide and may exist as a crystal, an amorphous substance or a mixture of a crystal and an amorphous substance depending on, for example, the properties, size and electron orbit of the element Z. Among them, the oxide is preferably amorphous for higher sensitivity for infrared radiation and less noise.

Figure 1:
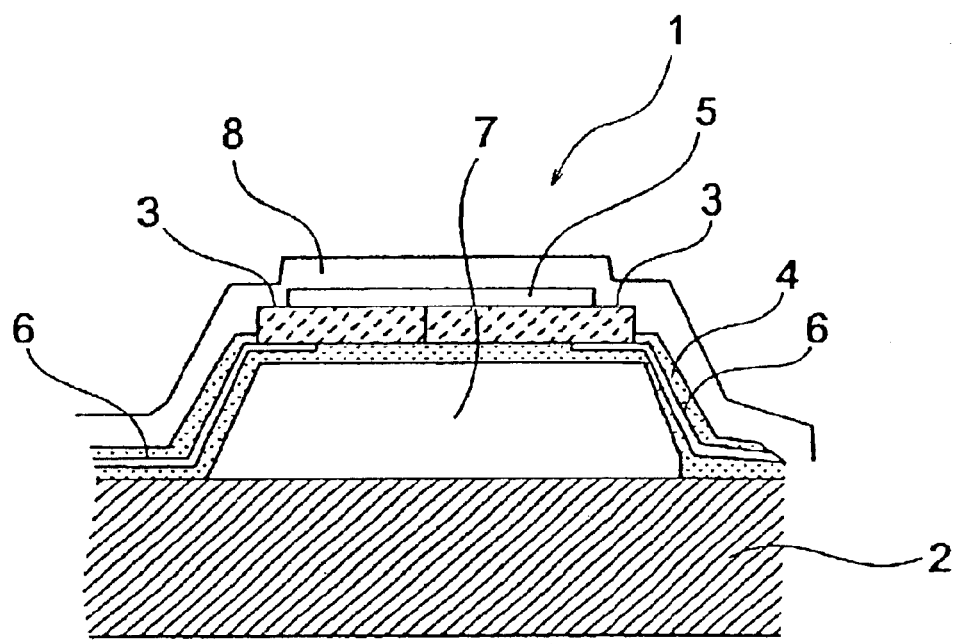
FIG. 1 is a sectional view of an infrared sensing element according to First and Second Embodiments of the present invention.

In the figures, reference numeral 1 is a photoreceptor, 2 is a Si substrate, 3 is an electrode, 4 is a bridge structure of a $SiO_2$ layer, 5 is a bolometer thin film, 6 is wiring, 7 is a cavity, 8 is a protecting film, 9 is a base, 10 is an electrode pad, 11 is a wire bond, 12 is a temperature sensor, and 13 is a current lead.

BEST MODE FOR CARRYING OUT THE INVENTION

The embodiments of the present invention will be illustrated in detail with reference to the attached drawings.
First Embodiment FIG. 1 is a sectional view of an infrared sensing element according to First Embodiment of the present invention. A photoreceptor 1 of the infrared sensing element comprises a silicon substrate 2, a bridge structure 4 including a silicon oxide layer, and a cavity 6 for thermal insulation formed between the silicon substrate 2 and the bridge structure 4. The silicon oxide layer is formed by plasma CVD. In addition, a wiring 3 composed of titanium nitride (TiN) extends along a support leg of the bridge structure 4 of the silicon oxide layer to the silicon substrate 2. A bolometer thin film 5 is arranged on the silicon oxide layer and part of the electrode 3. As an infrared detection circuit, the photoreceptor 1 absorbs infrared radiation and changes its temperature to thereby change electric resistance of the bolometer thin film 5. A bias voltage is applied from both ends of the electrode 3 lying underneath the bolometer thin film 5 to detect the resistance change to thereby detect infrared radiation.

Figure 2:
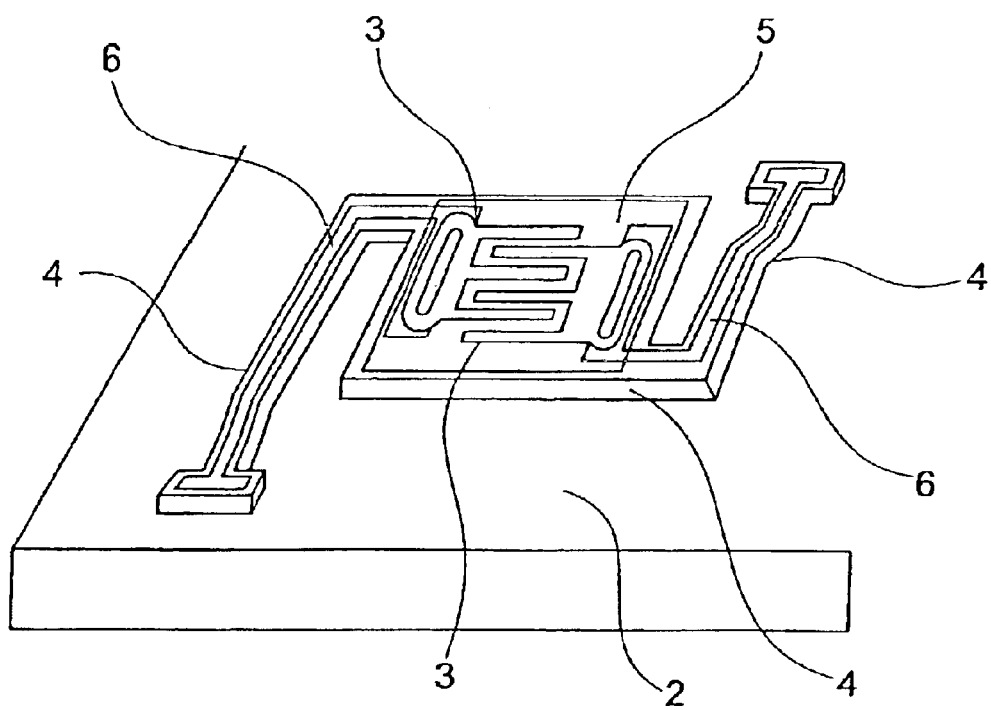
FIG. 2 is a perspective view of the infrared sensing element according to First and Second Embodiments of the present invention.

FIG. 2 is a perspective view of the infrared sensing element according to First Embodiment of the present invention. FIG. 2 perspectively illustrates the electrode 3 and wiring 6 lying underneath the bolometer thin film 5 to show the shapes thereof and does not illustrate a protecting film 7. The electrode 3 is formed as a multi-fingered electrode. Supports 6 of the bridge structure 4 each have a slim structure to increase thermal insulation property of the photoreceptor 1. The configurations and shapes of the infrared sensing element and its surrounding components shown in First Embodiment are shown as an embodiment of the present invention and are not intended to limit the scope of the invention.

In First Embodiment, $CuO_x$, where $0.5<x<1.2$, is used as a bolometer material. The bolometer thin film 5 is formed by sputtering without heating and cooling the silicon substrate 2. A thin film of $CuO_x$, where $0.5<x<0.9$, is formed by sputtering using a sintered compact of cuprous oxide ($Cu_2O$) as a target and a gaseous mixture of argon (Ar) and oxygen ($O_2$) as a sputtering gas at a constant gas pressure in a chamber of 0.8 Pa. In this procedure, x is controlled by changing an oxygen partial pressure in a range from 0% to 10%. A thin film of $CuO_x$, where $0.8<x<1.1$, is formed by sputtering using a sintered compact of cupric oxide (CuO) as a target and a gaseous mixture of argon (Ar) and oxygen ($O_2$) as a sputtering gas at a constant gas pressure in a chamber of 0.8 Pa. In this procedure, x is controlled by changing an oxygen partial pressure in a range from 0% to 10%. A thin film of $CuO_x$, where $1.1<x<1.2$, is formed by sputtering using a sintered compact of cupric oxide (CuO) as a target and a gaseous mixture of argon (Ar) and ozone ($O_3$) as a sputtering gas at a constant gas pressure of 0.8 Pa. In this procedure, x is controlled by changing an ozone ($O_3$) gas partial pressure in a range from 10% to 20%. After the bolometer thin film 5 is formed and is patterned, the protecting film 7 composed of silicon oxide is applied by coating to the outermost layer of the photoreceptor 1.

Figure 3:
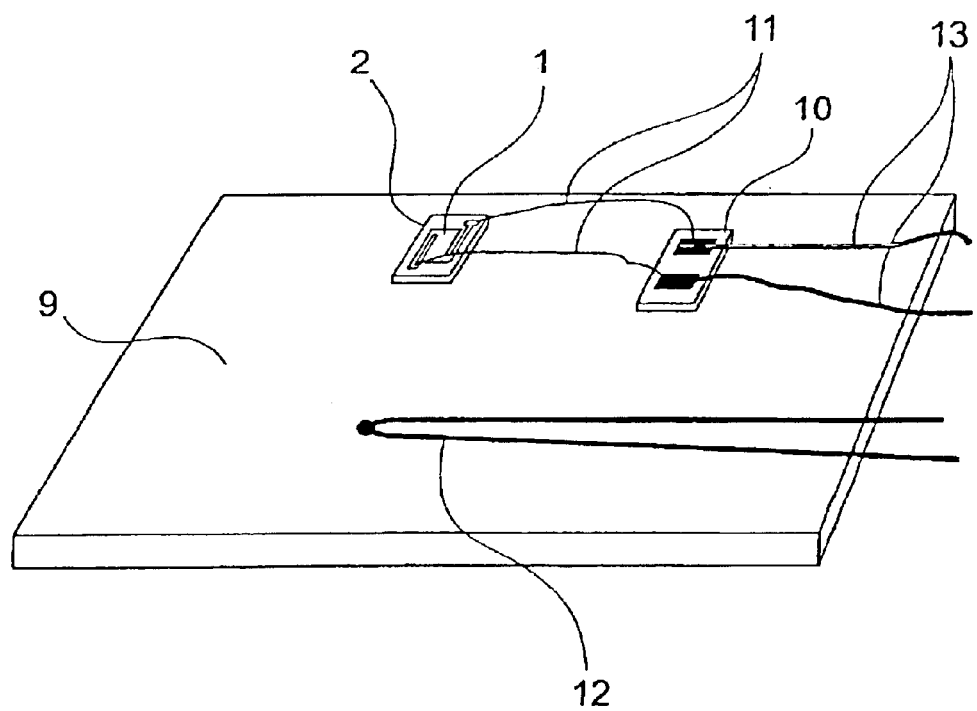
FIG. 3 illustrates a tool for the measurement of electric resistance.
Figure 4:
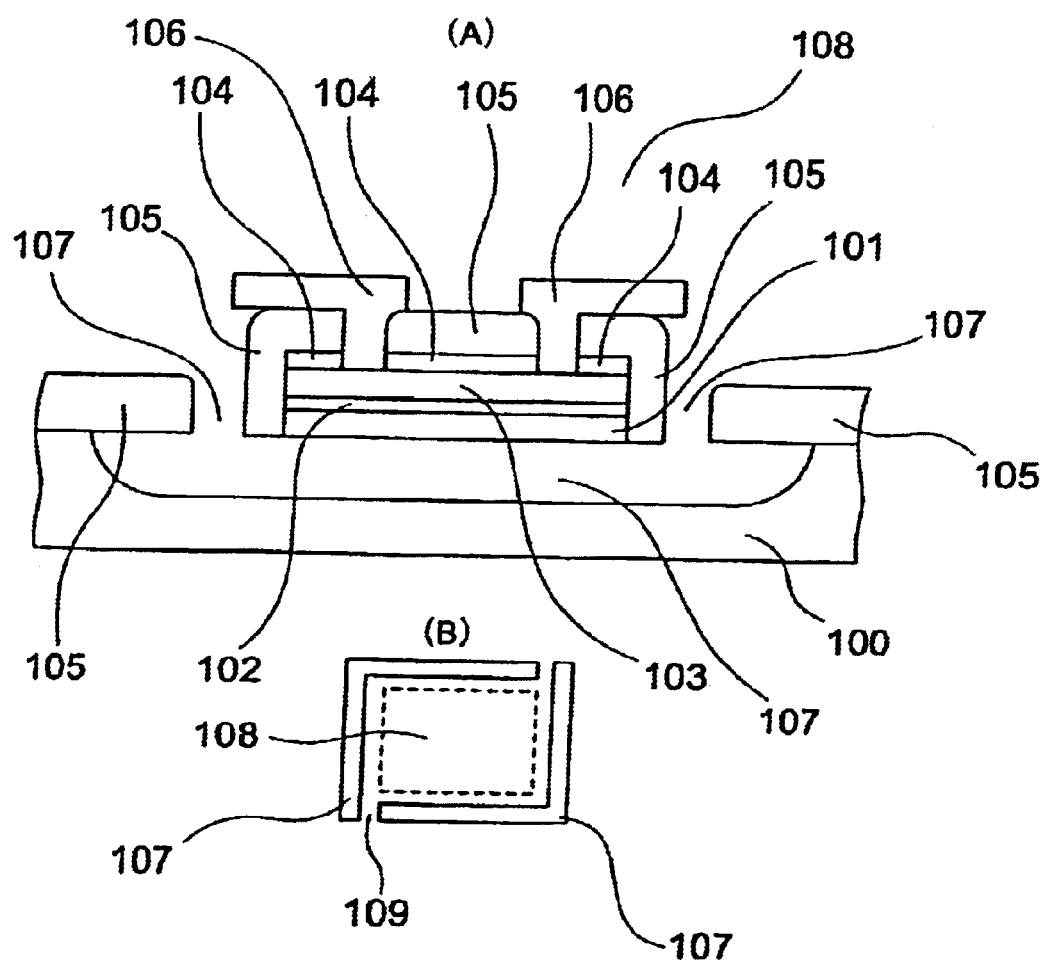
FIG. 4(A) is a sectional view of a conventional infrared sensing element and FIG. 4(B) is a top view of the infrared sensing element.

FIG. 3 illustrates a tool for the measurement of electric resistance. An energizing test was performed in the following manner as shown in FIG. 3. Initially, the silicon substrate 2 as an infrared sensing element was bonded to a base 9 with an adhesive such as Aron alpha, and an electrode pad 10 was connected to the wiring 6 on the silicon substrate 2 using a wire 11 by wire bonding, and an electrode lead 13 was connected to the electrode pad 10. A temperature sensor 12 was fixed to the base 9 by bonding with an adhesive such as Aron alpha in the same manner as in the infrared sensing element. A constant current controlled so as to yield a voltage of 3.5 V at 30° C. was then supplied to thereby determine electric resistance by direct-current two terminals process. The base 9 was placed in a thermostat bath which can vary in temperature from 0° C. to 70° C., resistances at respective temperatures were determined, and the temperature coefficient of resistance (|TCR|) was calculated according to the following equation (1). In the equation (1), t is the temperature and ρ is the resistivity.

$$|TCR|=\delta\rho/\delta t/t\times 100 \quad (1)$$

When x is equal to or more than 0.6 and less than 1.0, the infrared sensing elements of the present invention have |TCR| at a temperature of 300 K of equal to or more than 3.0%/K and less than or equal to 3.7%/K. When x is more than 0.5 and less than 0.6 or is equal to or more than 1.0 and less than 1.2, the infrared sensing elements have |TCR| of equal to or more than 1.5%/K and less than 3.0%/K, indicating that some of these thin films have a low |TCR| of less than or equal to 2%/K. In X ray diffractometry on crystallinity of the resulting thin films, those having a low |TCR| of less than or equal to 2.0%/K exhibit crystal peaks of CuO or $Cu_2O$. Thin films having |TCR| of equal to or more than 2.5%/K exhibit a pattern of an amorphous substance, and those having |TCR| of equal to or more than 2.0%/K and less than 2.5%/K exhibit a broad pattern similar to the crystal peaks of CuO or $Cu_2O$. When a thin film, where $0.5<x<0.6$ or $1.0\leq x<1.2$, was formed while the temperature of the substrate was held at 15° C. to 20° C. by water-cooling, the resulting thin film did not show the crystal peaks of CuO or $Cu_2O$ or a broad pattern similar to the crystal peaks and had |TCR| of equal to or more than 2.5%/K and less than 3.0%/K. A thin film, where $0.6\leq x\leq 1.0$, was found to exhibit a low noise voltage in a region of frequency of less than or equal to 2 KHz. These thin films were then observed with an atomic force microscope (AFM) and were found to have a texture comprising accumulated fine particles of less than or equal to 50 nm and having a highly smooth surface. It is considered that the interface between the thin film and the electrode has a reduced contact resistance to thereby reduce the voltage noise. A thin film having |TCR| of equal to or more than 3.0%/K and less than or equal to 3.4%/K has a resistivity (ρ) of equal to or more than 15 Ωcm and less than or equal to 140 Ωcm. By using multi-fingered electrodes and controlling the thickness, the thin film can have a reduced sheet resistance of less than or equal to 100 kΩ to thereby yield an infrared sensing element that can operate in a detection circuit and exhibits high sensitivity.

As is described above, by using $CuO_x$ as a main component, the bolometer material according to First Embodiment has an increased temperature coefficient of resistance (|TCR|) to thereby increase the sensitivity of an infrared sensing element using the bolometer material.

In addition, by setting x in the main component $CuO_x$ of the bolometer material at more than 0.5 and less than 1.2, the resulting bolometer material can have an increased temperature coefficient of resistance (|TCR|) at 300 K of equal to or more than 2.5%/K to thereby further improve the is sensitivity of the resulting infrared sensing element.

By using an amorphous film mainly containing $CuO_x$, where $0.5<x<1.2$, as the bolometer thin film, the bolometer thin film has a structure comprising accumulated fine particles of less than or equal to 50 nm and having a highly smooth surface and exhibits a reduced noise voltage. The sensitivity of the infrared sensing element using this bolometer thin film can thereby be increased.

When a bolometer thin film mainly containing $CuO_x$, where $0.5<x<1.2$, is produced by a process comprising the step of forming a thin film by sputtering using $Cu_2O$, CuO or a mixture of $Cu_2O$ and CuO as a target, x can be easily controlled with high reproducibility to thereby yield a bolometer thin film having desired properties.

The bolometer-type infrared sensing element for electrically detecting a temperature change induced by absorption of infrared radiation comprises a silicon (Si) substrate, a silicon dioxide ($SiO_2$) layer lying over the silicon substrate, a wiring layer lying over part of the silicon dioxide ($SiO_2$) layer, an electrode layer lying over part of the wiring layer and part of the silicon dioxide ($SiO_2$) layer, and a bolometer thin film lying over part of the electrode layer and part of the silicon dioxide ($SiO_2$) layer and mainly containing $CuO_x$ where $0.5<x<1.2$. Accordingly, the electrode layer can supply a bias current to the bolometer thin film having a high temperature coefficient of resistance (|TCR|), and the infrared sensing element can read signals with high sensitivity.

The bolometer thin film is patterned as a multi-fingered form, can thereby have a reduced sheet resistance in spite of its high temperature coefficient of resistance (|TCR|) and can yield an infrared sensing element that can operate in a detection circuit.

By setting x in the main component $CuO_x$ of the bolometer material at equal to or more than 0.6 and less than 1.0, the resulting bolometer material can have an increased temperature coefficient of resistance (|TCR|) at room temperature of equal to or more than 3.0%/K to thereby further improve the sensitivity of the resulting infrared sensing element.

Second Embodiment

An infrared sensing element according to Second Embodiment of the present invention has entirely the same configuration as in First Embodiment. In Second Embodiment, a material composed of $CaCuO_x$, where $1.5<x<2.2$, is used as the bolometer material.

Second Embodiment will be illustrated in further detail with reference to FIGS. 1 to 3. The bolometer thin film 5 is formed by sputtering without heating and cooling the silicon substrate 2. A thin film of $CaCuO_x$, where $0.5<x<1.0$, is formed by sputtering using a hot-pressed sintered compact of a mixture of cuprous oxide ($Cu_2O$) and calcium oxide (CaO) as a target and a gaseous mixture of argon (Ar) and oxygen ($O_2$) as a sputtering gas at a constant gas pressure in a chamber of 0.8 Pa. In this procedure, x is controlled by changing an oxygen partial pressure in a range from 0% to 10%. A thin film of $CaCuO_x$, where $1.0<x<1.5$, is formed by sputtering using the same target as in the thin film of $CaCuO_x$ where $0.5<x<1.0$ and a gaseous mixture of argon (Ar) and ozone ($O_3$) as a sputtering gas at a constant gas pressure in a chamber of 0.8 Pa. In this procedure, x is controlled by changing an ozone partial pressure in a range from 5% to 10%. A thin film of $CaCuO_x$, where $1.5<x<2.1$, is formed by sputtering using a hot-pressed sintered compact of a mixture of cupric oxide (CuO) and calcium oxide (CaO) as a target and a gaseous mixture of argon (Ar) and oxygen ($O_2$) as a sputtering gas at a constant gas pressure of 0.8 Pa. In this procedure, x is controlled by changing an oxygen partial pressure in a range from 0% to 10%. In the production of a thin film of $CaCuO_x$ where $2.0<x<2.2$, a pressed molding of a powder mixture of cupric oxide (CuO) and calcium oxide (CaO) is fired at 1200° C. in an atmosphere of oxygen gas for 24 hours, the fired mixture is pulverized, the resulting powder is sintered by hot-pressing and thereby yields a sputtering target. The film is formed by sputtering using this sputtering target and a gaseous mixture of argon (Ar) and ozone ($O_3$) as a sputtering gas at a constant gas pressure of 0.8 Pa. In this procedure, x is controlled by changing an ozone ($O_3$) gas partial pressure in a range from 5% to 20%. The resulting bolometer thin film 5 is patterned, and the protecting film 7 composed of silicon oxide is applied by coating to the outermost layer of the photoreceptor 1.

The electric properties of the infrared sensing element were determined in the same manner as in First Embodiment. As a result, the infrared sensing element according to Second Embodiment had |TCR| of equal to or more than 2.5%/K and less than or equal to 3.8%/K, where $1.5<x<2.2$, and a resistivity ($\rho$) of equal to or more than 30 Ωcm and less than or equal to 300 Ωcm at 300 K.

By using multi-fingered electrodes and controlling the film thickness, the resulting thin film had a decreased sheet resistance of less than or equal to 100 kΩ and thereby yielded an infrared sensing element that can operate with high sensitivity in a detection circuit.

The crystallinity of the thin film of $CaCuO_x$ where $1.5<x<2.2$ was analyzed by X ray diffractometry and was found to exhibit a broad pattern of an amorphous substance.

A thin film where $0.6 \leq x \leq 1.0$ was found to exhibit a low noise voltage in a frequency region of less than or equal to 2 KHz. The thin film was then observed with an atomic force microscope (AFM) and was found to have a texture comprising accumulated fine particles of a size of less than or equal to 30 nm and having a highly smooth surface. It is considered that the interface between the thin film and the electrode has a reduced contact resistance to thereby reduce the voltage noise.

As a comparative example to Second Embodiment, an infrared sensing element having entirely the same configuration as in First and Second Embodiments was prepared using a thin film of $YBa_2Cu_3O_{7.5}$ as a bolometer material. As a sputtering target powder mixture of $Y_2O_3$, CuO and $BaCO_3$ was molded by pressing, the resulting molding was fired at 1200° C. in an atmosphere of oxygen gas for 24 hours, the fired mixture was pulverized, the resulting powder was sintered by hot pressing and thereby yielded the sputtering target. The $YBa_2Cu_3O_{7.5}$ thin film was formed using a gaseous mixture of Ar and $O_2$ as a sputtering gas at an oxygen partial pressure of 1% and a gas pressure of 0.8 Pa without heating and cooling the silicon substrate 2. When the target had a diameter of 3 inches and a thickness of 5 mm, the target cracked after a film formation procedure at a power of 50 W for 100 minutes was repeated 15 times. In contrast, the target for the formation of a thin film of $CaCuO_x$ where $1.5<x<2.2$ did not crack even after the film formation procedure was repeated 50 times.

Next, the stability in the air of the thin film was analyzed. A thin film of $YBa_2Cu_3O_{7.5}$ was formed, was taken out from a chamber, and was placed in another chamber for the formation of a protecting film about 2 minutes later. After evacuating the chamber to $10^{-5}$ Pa, the protecting film was formed and thereby yielded Sample A. Another $YBa_2Cu_3O_{7.6}$ thin film was formed, was taken out from the chamber, was left at a temperature of 25° C. at a humidity of 40% in the air for 3 hours or 24 hours, the protecting film was then formed and thereby yielded Samples B and C. Sample A had |TCR| of 3.2/K and $\rho$ of 90 Ωcm. Samples B and C had $\rho$ 1.3 times and 1.5 times higher than that of Sample A, respectively. In contrast, the $CaCuO_x$ thin film, where $1.5<x<2.2$, of the present invention increased in $\rho$ by a factor of 3% or less even when it was left at a temperature of 25° C. at a humidity of 40% in the air for 24 hours.

Second Embodiment has been illustrated by taking a thin film of $CaCuO_x$ where $0.5<x<2.2$ as an example. However, even by using $Z_yCuO_x$ where Z is an alkaline earth metal other than calcium, the resulting bolometer thin film has a high |TCR| and a low noise voltage as in the case where calcium is used. In addition, the target or the bolometer thin film exhibits less deterioration, the bolometer thin film can thereby easily be produced, and the sensitivity of the resulting infrared sensing element can be increased.

Third Embodiment

An infrared sensing element according to Third Embodiment of the present invention has entirely the same configuration as in First Embodiment, except that an oxide (Ba—Cu—O) composed of barium (Ba), Cu and O is used as a bolometer material. A thin film of Ba—Cu—O was formed by sputtering using a sintered compact of an oxide having a molar ratio of metal element Ba to Cu of 2:3 as a target and Ar gas as a sputtering gas at a constant gas pressure of 0.8 Pa without heating and cooling the substrate. The target was prepared in the following manner. A mixture of a $BaO_2$ powder and a CuO powder each having a particle size of less than or equal to 0.5 μm was mixed and pressed under flow of Ar gas, the resulting molding was placed in a quartz tube, the tube was sealed in vacuo, the material in the tube was allowed to react at 700° C. for 20 hours to thereby yield a $Ba_2Cu_3O_{5.9}$ compound, and a powder of the $Ba_2Cu_3O_{5.9}$ compound was sintered by hot pressing. The $Ba_2Cu_3O_{5.9}$ compound can form a solid solution in a wide area of compositions, is stable, and the resulting sintered target had good moisture resistance. When the target had a diameter of 3 inches and a thickness of 5 mm, the target did not crack even after a film formation procedure at 50 W for 100 minutes was repeated 30 times.

Next, the crystallinity of the above-prepared Ba—Cu—O thin film was analyzed by X ray diffractometry and was found to exhibit a broad pattern of an amorphous substance. After the amorphous Ba—Cu—O thin film was patterned as a bolometer, the protecting film 7 composed of silicon oxide was applied by coating to the outermost layer of the photoreceptor 1.

The electric properties of the infrared sensing element were determined in the same manner as in First Embodiment. As a result, the infrared sensing element according to Third Embodiment had |TCR| at 300 K of 3.5%/K and ρ of 150 Ωcm. By using multi-fingered electrodes and controlling the film thickness, the sheet resistance of the film could be reduced to less than or equal to 100 kΩ. The resulting infrared sensing element could serve as a circuit as an infrared sensing element without any problem.

Subsequently, a direct current voltage of 3.5 V was applied and a bias current was supplied between the multi-fingered electrodes of the infrared sensing element according to Third Embodiment without application of infrared radiation. A noise voltage during this procedure was determined with a frequency spectrum detector. As a result, the noise voltage was 250 $nV/(Hz)^{1/2}$ at a frequency of 110 Hz which is half or less that of conventional commercially available $V_2O_3$ thin film bolometers. The sensitivity of such an infrared sensing element is inversely proportional to the noise voltage. The above results show that the sensitivity of the infrared sensing element according to Third Embodiment is increased by a reduced noise voltage and an increased |TCR| synergistically.

As is evident from the above, by containing $Z_yCuO_x$, where Z is an alkaline earth metal; $0 \leq y \leq 2$; and $0.5y < x \leq 1.5+2y$ as a main component, the bolometer materials according to Second and Third Embodiments each have an increased temperature coefficient of resistance (|TCR|) to thereby increase the sensitivity of the resulting infrared sensing elements using the bolometer materials.

By setting y and x in the main component $Z_yCuO_x$ of the bolometer materials at $0 < y < 1.2$ and $y < x \leq 1.5+y$, the resulting bolometer materials each have an increased temperature coefficient of resistance (|TCR|) at 300 K of equal to or more than 3%/K to thereby further improve the sensitivity of the infrared sensing elements.

In addition, by using an amorphous film mainly containing $Z_yCuO_x$, where Z is an alkaline earth metal; $0 \leq y \leq 2$; and $0.5y < x \leq 1.5+2y$, as the bolometer thin film, the thin film has a texture comprising accumulated fine particles of less than or equal to 50 nm and having a highly smooth surface and exhibits a reduced noise voltage to thereby increase the sensitivity of the infrared sensing element using the bolometer thin film.

By producing a bolometer thin film mainly containing $Z_yCuO_x$, where Z is an alkaline earth metal; $0 \leq y \leq 2$; and $0.5y < x \leq 1.5+2y$, by sputtering using a mixture of an oxide of Z and an oxide of Cu or a complex oxide of these elements as a target, x can easily be controlled with good reproducibility to thereby yield a bolometer thin film having desired properties.

The bolometer-type infrared sensing element for electrically detecting a temperature change induced by absorption of infrared radiation comprises a silicon (Si) substrate, a silicon dioxide ($SiO_2$) layer lying over the silicon substrate, a wiring layer lying over part of the silicon dioxide ($SiO_2$) layer, an electrode layer lying over part of the wiring layer and part of the silicon dioxide ($SiO_2$) layer, and a bolometer thin film lying over part of the electrode layer and part of the silicon dioxide ($SiO_2$) layer and mainly containing $Z_yCuO_x$, where Z is an alkaline earth metal; $0 \leq y \leq 2$; and $0.5y < x \leq 1.5+2y$. Accordingly, the electrode layer can supply a bias current to the bolometer thin film having a high temperature coefficient of resistance (|TCR|), and the infrared sensing element can read signals with high sensitivity.

The bolometer thin film is patterned in a multi-fingered form, can thereby have a reduced sheet resistance in spite of its high temperature coefficient of resistance (|TCR|) and can yield an infrared sensing element that can operate in a detection circuit.

Fourth Embodiment

Infrared sensing elements according to Fourth Embodiment of the present invention each have entirely the same configuration as in First, Second and Third Embodiments, except that an oxide (Y—Cu—O) composed of yttrium (Y), Cu and O or an oxide (La—Cu—O) composed of lanthanum (La), Cu and O is used as a bolometer material.

A thin film of Y—Cu—O was formed by sputtering using a sintered compact of $YCuO_2$ as a target and a gaseous mixture of Ar and $O_2$ in a ratio of Ar to $O_2$ of 9:1 as a sputtering gas at a constant gas pressure of 0.8 Pa without heating and cooling the substrate. A thin film of La—Cu—O was formed by sputtering using a sintered compact of $LaCuO_3$ as a target and Ar gas as a sputtering gas at a constant gas pressure of 0.8 Pa without heating and cooling the substrate.

The $YCuO_2$ sputtering target was prepared in the following manner. A $Y_2O_3$ powder and a $Cu_2O$ powder each having a particle size of less than or equal to 0.5 μm were weighed and mixed with each other in the air so that the metal element molar ratio of Y to Cu was 1:1, the resulting powder mixture-was pressed, the resulting molding was allowed to react at 1370° C. under flow of $N_2$ gas for 100 hours and thereby yielded a $YCuO_2$ compound. The compound was further pulverized, the pulverized powder was sintered by hot-pressing and thereby yielded the $YCuO_2$ sputtering target. The $YCuO_2$ compound was stable, and the sintered target obtained therefrom exhibited good moisture resistance and high durability upon the film formation by sputtering. The $LaCuO_3$ sputtering target was prepared in the following manner. A $La_2O_3$ powder and a CuO powder each having a particle size of less than or equal to 0.5 μm were weighed and mixed with each other in the air so that the metal element molar ratio of La to Cu was 1:1, the resulting powder mixture was pressed, the resulting molding was allowed to react at 1400° C. under flow of $O_2$ gas for 100 hours and thereby yielded a $LaCuO_3$ compound. The compound was further pulverized, the pulverized powder was sintered by hot-pressing and thereby yielded the $LaCuO_3$ sputtering target. The $LaCuO_3$ compound was stable, and the sintered target obtained therefrom exhibited no problem in moisture resistance and durability upon the film formation by sputtering.

Next, the crystallinity of the Y—Cu—O thin film obtained by sputtering was analyzed by X ray diffractometry and was found to be amorphous. The Y—Cu—O thin film was then patterned as a bolometer, the protecting film 7 composed of silicon oxide was applied by coating to the outermost layer of the photoreceptor 1 and thereby yielded an infrared sensing element. Separately, the crystallinity of the La—Cu—O thin film obtained by sputtering was analyzed by X ray diffractometry and was found to be amorphous. The La—Cu—O thin film was then patterned as a bolometer, the protecting film 7 composed of silicon oxide was applied by coating to the outermost layer of the photoreceptor 1 and thereby yielded an infrared sensing element.

The electric properties of the infrared sensing elements using two types of bolometer materials according to Fourth Embodiment were determined in the same manner as in First Embodiment. As a result, the infrared sensing elements using the Y—Cu—O thin film bolometer and the La—Cu—O thin film bolometer according to Fourth Embodiment had |TCR| of 3.7%/K and 3.5%/K and ρ of 250 Ωcm and 180 Ωcm, respectively, at 300 K. By using multi-fingered electrodes and controlling the film thickness, the sheet resistance of the films could be reduced to less than or equal to 100 kΩ. The resulting infrared sensing elements could operate as an infrared sensing element in a circuit without any problem.

Subsequently, the noise voltages of the infrared sensing elements according to Fourth Embodiment were determined in the same manner as in Third Embodiment. As a result, the two infrared sensing elements each had a satisfactorily low noise voltage of 150 to 200 nV/(Hz)$^{1/2}$ at a frequency of 110 Hz.

These results indicate that the infrared sensing elements according to Fourth Embodiment each have an increased |TCR| and a reduced noise voltage, both of which synergistically contribute to increased sensitivity.

While not described in Fourth Embodiment, the present inventors have verified that infrared sensing elements each using a thin film mainly containing an oxide composed of Cu, O and at least one element selected from lanthanoid elements other than La as a bolometer also exhibit an increased |TCR| and a reduced noise voltage and thereby have high sensitivity.

Fifth Embodiment

An infrared sensing element according to Fifth Embodiment of the present invention has entirely the same configuration as in First, Second, Third, and Fourth Embodiments, except that an oxide (Bi—Cu—O) composed of bismuth (Bi), Cu and O is used as a bolometer material.

A thin film of Bi—Cu—O was formed by sputtering using a sintered compact as a target and a gaseous mixture of Ar and O$_2$ in a ratio of Ar to O$_2$ of 99:1 as a sputtering gas at a constant gas pressure of 0.8 Pa without heating and cooling the substrate. The target was prepared in the following manner. Specifically, a Bi$_2$O$_3$ powder and a CuO powder each having a particle size of less than or equal to 0.5 μm were weighed and mixed with each other so that the metal element molar ratio of Bi to Cu was 1:1, the resulting powder mixture was calcined at 750° C. in the air for 24 hour, the calcined powder was hot-pressed and thereby yielded the sintered target. The sintered Bi—Cu—O target exhibited no problem in moisture resistance and durability upon the film formation by sputtering.

The crystallinity of the Bi—Cu—O thin film obtained by sputtering was analyzed by X ray diffractometry and was found to be amorphous. The thin film was then patterned as a bolometer, the protecting film 7 composed of silicon oxide was applied by coating to the outermost layer of the photoreceptor 1 and thereby yielded an infrared sensing element.

The electric properties of the infrared sensing element according to Fifth Embodiment were determined in the same manner as in First Embodiment. As a result, the infrared sensing element according to Fifth Embodiment had |TCR| of 3.6%/K and ρ of 210 Ωcm at 300 K. By using multi-fingered electrodes and controlling the film thickness, the sheet resistance of the film could be reduced to less than or equal to 100 kΩ. The resulting infrared sensing element could operate in a circuit as an infrared sensing element without any problem.

Subsequently, the noise voltages of the infrared sensing element according to Fifth Embodiment were determined in the same manner as in Third Embodiment. As a result, the infrared sensing element had a satisfactorily low noise voltage of 150 to 200 nV/(Hz)$^{1/2}$ at a frequency of 110 Hz.

These results indicate that the infrared sensing element according to Fifth Embodiment has an increased |TCR| and a reduced noise voltage, both of which synergistically contribute to increased sensitivity.

While not described in Fifth Embodiment, the present inventors have verified that infrared sensing elements each using a thin film mainly containing an oxide composed of at least one element selected from elements belonging to Period 5 or Period 6 of the Periodic Table selected from lead (Pb), cadmium (Cd), mercury (Hg) and thallium (Tl), and copper (Cu) and oxygen (O) as a bolometer also exhibit an increased |TCR| and a reduced noise voltage and thereby have high sensitivity.

Sixth Embodiment

Infrared sensing elements according to Sixth Embodiment of the present invention have entirely the same configuration as in First, Second, Third, Fourth and Fifth Embodiments, except that an oxide (K—Cu—O) composed of potassium (K), Cu and O or an oxide (Na—Cu—O) composed of sodium (Na), Cu and O is used as a bolometer material.

A thin film of K—Cu—O was prepared by sputtering using a sintered K$_3$Cu$_5$O$_4$ as a target and a gaseous mixture of Ar and O$_2$ in a ratio of Ar to O$_2$ of 9:1 as a sputtering gas at a constant gas pressure of 0.8 Pa without heating and cooling the substrate to yield the K—Cu—O thin film bolometer. A thin film of Na—Cu—O was prepared by sputtering using a sintered NaCuO as a target and a gaseous mixture of Ar and O$_2$ in a ratio of Ar to O$_2$ of 9:1 as a sputtering gas at a constant gas pressure of 0.8 Pa without heating and cooling the substrate to yield the bolometer.

The K$_3$Cu$_5$O$_4$ sputtering target was prepared in the following manner. Specifically, a Y$_2$O$_3$ powder and a Cu$_2$O powder each having a particle size of less than or equal to 0.5 μm were weighed and mixed with each other so that the metal element molar ratio of K to Cu was 3:5, the resulting powder mixture was pressed in Ar gas atmosphere, the resulting molding was allowed to react at 800° C. under flow of Ar gas for 100 hours and thereby yielded a K$_3$Cu$_5$O$_4$ compound. The compound was further pulverized, the pulverized powder was sintered by hot-pressing and thereby yielded the K$_3$Cu$_5$O$_4$ sputtering target. It was expected the K$_3$Cu$_5$O$_4$ compound is inferior in moisture resistance. However, the resulting K$_3$Cu$_5$O$_4$ target did not crack even when the compound was formed into a target having a diameter of 3 inches and a thickness of 5 mm and was subjected to vacuum sputtering process at 50 W for 100 minutes 30 times repeatedly.

The NaCuO sputtering target was prepared in the following manner. Specifically, a Na$_2$O$_3$ powder and a Cu$_2$O powder each having a particle size of less than or equal to 0.5 μm were weighed and mixed with each other so that the metal element molar ratio of Na to Cu was 3:5, the resulting powder mixture was pressed in Ar gas atmosphere, the molding was allowed to react at 800° C. under flow of Ar gas for 100 hours and thereby yielded a NaCuO compound. The compound was further pulverized, the pulverized powder was sintered by hot-pressing and thereby yielded the NaCuO sputtering target. It was also expected the NaCuO compound is inferior in moisture resistance. However, the resulting NaCuO target did not crack even when the compound was formed into a target having a diameter of 3 inches and a thickness of 5 mm and was subjected to vacuum sputtering process at 50 W for 100 minutes 30 times repeatedly.

Next, the crystallinity of the K—Cu—O thin film and the Na—Cu—O thin film obtained by sputtering were determined by X ray diffractometry and were found to be amorphous. Each of the two thin films was patterned as a bolometer, and the protecting film 7 composed of silicon oxide was coated to the outermost layer of the photoreceptor 1 and thereby yielded infrared sensing elements.

The electric properties of the infrared sensing elements using two types of bolometer materials according to Sixth Embodiment were determined in the same manner as in First Embodiment. As a result, the infrared sensing element using the K—Cu—O thin film bolometer and the Na—Cu—O thin film bolometer according to Sixth Embodiment had |TCR| of 3.1%/K and 3.2%/K and $\rho$ of 50 $\Omega$cm and 80 $\Omega$cm, respectively, at 300 K. By using multi-fingered electrodes and controlling the film thickness, the sheet resistance of the films could be reduced to less than or equal to 100 k$\Omega$. The resulting infrared sensing elements could operate in a circuit as an infrared sensing element without any problem.

Subsequently, the noise voltages of the infrared sensing elements according to Sixth Embodiment were determined in the same manner as in Third Embodiment. As a result, the two infrared sensing elements each have a satisfactorily low noise voltage of 250 to 300 nV/(Hz)$^{1/2}$ at a frequency of 110 Hz.

These results indicate that the infrared sensing elements according to Fourth Embodiment each have a reduced noise voltage and an increased |TCR|, both of which synergistically contribute to increased sensitivity.

Seventh Embodiment

Infrared sensing elements according to Seventh Embodiment of the present invention have entirely the same configuration as in First, Second and Third Embodiments, except that a composition containing Y—Cu—O as a main component and lithium (Li) as an accessory component, or a composition containing La—Cu—O as a main component and gold (Au) as an accessory component is used as a bolometer material.

A thin film of the composition containing Y—Cu—O as a main component and Li as an accessory component was prepared by sputtering using a sintered Li-added YCuO$_2$ as a target and a gaseous mixture of Ar and O$_2$ in a ratio of Ar to O$_2$ of 9:1 as a sputtering gas at a constant gas pressure of 0.8 Pa without heating and cooling the substrate. Separately, a thin film of the composition containing La—Cu—O as a main component and Au as an accessory component was prepared by sputtering using a sintered Au-added LaCuO$_3$ as a target and Ar gas as a sputtering gas at a constant gas pressure of 0.8 Pa without heating and cooling the substrate.

The Li-added YCuO$_2$ sputtering target was prepared in the following manner. A Y$_2$O$_3$ powder, a Cu$_2$O powder and a Au powder each having a particle size of less than or equal to 0.5 $\mu$m were weighed and mixed with one another so that the metal element molar ratio of Y:Cu:Li was 1:1:0.1, the resulting powder mixture was pressed in the air, the resulting molding was allowed to react at 1100° C. under flow of N$_2$ gas for 100 hours and thereby yielded a Li-added YCuO$_2$ compound. The compound was further pulverized, the pulverized powder was sintered by hot-pressing and thereby yielded the Li-added YCuO$_2$ sputtering target. The sintered Li-added YCuO$_2$ target exhibited satisfactory durability upon the film formation by sputtering. The Au-added LaCuO$_3$ sputtering target was prepared in the following manner. A La$_2$O$_3$ powder, a CuO powder and a Au powder each having a particle size of less than or equal to 0.5 $\mu$m were weighed and mixed with one another so that the metal element molar ratio of La:Cu:Au was 1:1:0.1, the resulting powder mixture was pressed in the air, the resulting molding was allowed to react at 1050° C. under flow of O$_2$ gas for 100 hours and thereby yielded a Au-added LaCuO$_3$ compound. The compound was further pulverized, the pulverized powder was sintered by hot-pressing and thereby yielded the Au-added LaCuO$_3$ sputtering target. The sintered Au-added LaCuO$_3$ target exhibited no problem in moisture resistance and durability upon the film formation by sputtering.

Next, the crystallinity of the Li-containing Y—Cu—O thin film obtained by sputtering was analyzed by X ray diffractometry and was found to be amorphous without deposition of Li. The Y—Cu—O thin film was then patterned as a bolometer, the protecting film 7 composed of silicon oxide was applied by coating to the outermost layer of the photoreceptor 1 and thereby yielded an infrared sensing element. Separately, the crystallinity of the Au-containing La—Cu—O thin film obtained by sputtering was analyzed by X ray diffractometry. As a result, a broad diffraction pattern as an amorphous substance with a slight Au diffraction peak was observed. The Au-containing La—Cu—O thin film was then patterned as a bolometer, the protecting film 7 composed of silicon oxide was applied by coating to the outermost layer of the photoreceptor 1 and thereby yielded an infrared sensing element.

The electric properties of the infrared sensing elements using two types of bolometer materials according to Seventh Embodiment were determined in the same manner as in First Embodiment. As a result, the infrared sensing elements using the Li-containing Y—Cu—O thin film bolometer and the Au-containing La—Cu—O thin film bolometer according to Seventh Embodiment had |TCR| of 3.5%/K and 3.4%/K, and $\rho$ of 20 $\Omega$cm and 10 $\Omega$cm at 300 K, respectively, showing that they have markedly reduced $\rho$. Accordingly, the resulting infrared sensing elements can have a reduced resistance between electrodes of less than or equal to 100 k$\Omega$ and can operate in a circuit as an infrared sensing element only by controlling the film thickness without the use of multi-fingered electrodes. In addition, the infrared sensing elements can use parallel electrodes and can easily be manufactured with a reduced size.

Subsequently, the noise voltages of the infrared sensing elements according to Seventh Embodiment were determined in the same manner as in Third Embodiment. As a result, the infrared sensing elements each have a satisfactorily low noise voltage of less than or equal to 300 nV/(Hz)$^{1/2}$ at a frequency of 110 Hz.

These results indicate that the infrared sensing elements according to Seventh Embodiment each have a reduced noise voltage and a reduced resistivity and that the present invention is very effective for production and design of highly sensitive infrared sensing elements.

The present inventors have experimentally verified that infrared sensing elements each mainly containing the bolometer material of the present invention using an oxide other than those mentioned in Seventh Embodiment also exhibit the same advantages of the invention shown in Seventh Embodiment by containing lithium (Li) or gold (Au) as an accessory component.

In the above embodiments of the present invention, the present inventors have experimentally verified that the bolometer materials of the present invention each have an increasing resistance with increasing y in $Z_yCuO_x$. Based on the finding, they also have found that bolometer materials, where y in $Z_yCuO_x$ exceeds 2, have therefore an excessively increased resistance, and the resulting infrared sensing elements do not suitably operate as infrared sensing elements in a circuit.

As elements which are suitable as Z in $Z_yCuO_x$, the above embodiments have been illustrated by taking elements which are likely to be monovalent, divalent or trivalent as an example. Ce and Pr belonging to the lanthanum series are likely to be tetravalent but yield advantages similar to those in the other lanthanum series elements which are likely to be trivalent as shown in Fourth Embodiment. The valency of Cu is supposed to be more than 0 and less than or equal to 3.

As is described above, the present invention has the following advantages. Specifically, the bolometer material of the present invention uses an oxide represented by $Z_yCuO_x$ as a main component, wherein Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium; y is a number satisfying the following condition: $0 \leq y \leq 2$; and x is a number satisfying the following condition: $0.5y < x \leq 1.5 + 2y$. By this configuration, the resulting bolometer material has an increased temperature coefficient of resistance (|TCR|) to thereby increase the sensitivity of an infrared sensing element using the bolometer material.

In addition, by controlling y and x in the main component $Z_yCuO_x$ of the bolometer material within ranges of $0 < y < 1.2$ and $y < x \leq 1.5 + y$, the resulting bolometer material has an increased temperature coefficient of resistance (|TCR|) of equal to or more than 3%/K at a temperature of 300 K to thereby further improve the sensitivity of the infrared sensing element.

By using $CuO_x$ as a main component, the bolometer material of the present invention has an increased temperature coefficient of resistance (|TCR|) to thereby improve the sensitivity of an infrared sensing element using the bolometer material.

Additionally, by controlling x of the main component $CuO_x$ of the bolometer material of the present invention in a range of $0.5 < x < 1.2$, the bolometer material has an increased temperature coefficient of resistance (|TCR|) at 300 K of equal to or more than 2.5%/K to thereby further improve the sensitivity of the resulting infrared sensing element.

The bolometer thin film of the present invention is an amorphous film mainly containing $Z_yCuO_x$, wherein Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium; y is a number satisfying the following condition: $0 \leq y \leq 2$; and x is a number satisfying the following condition: $0.5y < x \leq 1.5 + 2y$. By this configuration, the thin film has a texture comprising accumulated fine particles of less than or equal to 50 nm in size and having a highly smooth surface and exhibits a reduced noise voltage to thereby increase the sensitivity of the infrared sensing element using the bolometer thin film.

According to the present invention, a bolometer thin film mainly containing an oxide represented by: $Z_yCuO_x$, wherein Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium; y is a number satisfying the following condition: $0 \leq y \leq 2$; and x is a number satisfying the following condition: $0.5y < x \leq 1.5 + 2y$, is produced by a method including the step of forming the thin film by sputtering using a mixture of an oxide of Z and an oxide of Cu or a complex oxide of these elements as a target. By this configuration, x can easily be controlled with good reproducibility, and a bolometer thin film having desired properties can be obtained.

When a thin film mainly containing $CuO_x$, where $0.5 < x < 1.2$, is produced by a method comprising the step of forming the thin film by sputtering using $Cu_2O$, $CuO$, or a mixture of $Cu_2O$ and $CuO$ as a target, x can easily be controlled with good reproducibility, and a bolometer thin film having desired properties can be obtained.

The bolometer-type infrared sensing element of the present invention for electrically detecting a temperature change induced by absorption of infrared radiation comprises a silicon (Si) substrate, a silicon dioxide ($SiO_2$) layer lying over the silicon (Si) substrate, a wiring layer lying over part of the silicon dioxide ($SiO_2$) layer, an electrode layer lying over part of the wiring layer and part of the silicon dioxide ($SiO_2$) layer, and a bolometer thin film lying over part of the electrode layer and part of the silicon dioxide layer, which bolometer thin film mainly contains $Z_yCuO_x$, wherein Z is one or more of alkaline earth metals, one or more of rare earth elements selected from yttrium and lanthanoid elements, one or more of elements belonging to Period 5 or Period 6 of the Periodic Table selected from bismuth, lead, thallium, mercury and cadmium, or potassium or sodium; y is a number satisfying the following condition: $0 \leq y \leq 2$; and x is a number satisfying the following condition: $0.5y < x \leq 1.5 + 2y$. By this configuration, the electrode layer can supply a bias current to the bolometer thin film having a high temperature coefficient of resistance (|TCR|), and the infrared sensing element can read signals with high sensitivity.

By patterning the bolometer thin film just mentioned above in a multi-fingered form, the bolometer thin film can have a reduced sheet resistance in spite of its high temperature coefficient of resistance (|TCR|) and can yield an infrared sensing element that can operate in a detection circuit.

INDUSTRIAL APPLICABILITY

The bolometer material or the thin film obtained therefrom of the present invention exhibits a high temperature coefficient of resistance (|TCR|) and a low noise voltage, is excellent in detection sensitivity of infrared radiation and is useful as a highly sensitive infrared sensing element.

What is claimed is:

1. A bolometer comprising as an active material responsive to incident electromagnetic radiation an oxide consisting essentially $Z_yCuO_x$, wherein
    $0 \leq y \leq 2$ and $0.5y < x \leq 1.5 + 2y$, and
    Z is at least one selected from the group consisting of yttrium lanthanum, thallium, mercury, cadmium, and potassium.

2. The bolometer according to claim 1, wherein y equals zero.

3. The bolometer according to claim 2, wherein $0.5 < x < 1.2$.

4. The bolometer according to claim 2, wherein $0.6 \leq x < 1.0$.

5. The bolometer according to claim 1, wherein Z is selected from the group consisting of yttrium and lanthanum.

6. The bolometer according to claim 1, wherein Z is an selected from the group consisting of bismuth, thallium, mercury, and cadmium.

7. The bolometer according to claim 1, wherein Z is potassium.

8. The bolometer according to claim 1, further comprising one of lithium and gold as a minor constituent of the oxide.

9. The bolometer according to claim 1, further comprising:

a silicon substrate;

a silicon dioxide layer lying over the silicon substrate;

a wiring layer lying over part of the silicon dioxide layer;

an electrode layer lying over part of the wiring layer and part of the silicon dioxide layer; and the active material as claimed in claim 1 lying over part of the electrode layer and part of the silicon dioxide layer.

10. The bolometer according to claim 9, wherein the electrode layer is patterned in a multi-fingered form.

11. A bolometer comprising as an active material responsive to incident electromagnetic radiation an oxide consisting essentially of $Z_y CuO_x$ having an amorphous structure, wherein $0 \leq y \leq 2$ and $0.5y < x \leq 1.5 + 2y$, and Z is at least one selected from the group consisting of yttrium, lanthanum, thallium, mercury, cadmium, and potassium.

12. A method for manufacturing a bolometer, the method comprising forming a thin film as an active material of the bolometer responsive to incident electromagnetic radiation and comprising an oxide consisting essentially of $Z_y CuO_x$, wherein $0 \leq y \leq 2$, $0.5y < x \leq 1.5 + 2y$, and Z is at least one selected from the group consisting of yttrium, lanthanum, thallium, mercury, cadmium, and potassium by sputtering using a mixture of an oxide of Z and an oxide of Cu or a complex oxide as a target.

13. The method for manufacturing a bolometer according to claim 12, comprising forming the thin film of $CuO_x$, wherein $0.5 < x < 1.2$, by sputtering using $Cu_2O$, $CuO$, or a mixture of $Cu_2O$ and $CuO$ as a target.

* * * * *